(12) United States Patent
Liebaug et al.

(10) Patent No.: US 11,137,687 B2
(45) Date of Patent: Oct. 5, 2021

(54) OPTICAL ARRANGEMENT FOR EUV RADIATION WITH A SHIELD FOR PROTECTION AGAINST THE ETCHING EFFECT OF A PLASMA

(71) Applicant: Carl Zeiss SMT GmbH, Oberkochen (DE)

(72) Inventors: Bjoern Liebaug, Ulm (DE); Moritz Becker, Aalen (DE); Kerstin Hild, Schwaebisch Gmuend (DE); Joachim Hartjes, Aalen (DE); Simon Haas, Pfaffenhofen an der Ilm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/778,775

(22) Filed: Jan. 31, 2020

(65) Prior Publication Data

US 2020/0166847 A1    May 28, 2020

Related U.S. Application Data

(63) Continuation of application No. PCT/EP2018/069137, filed on Jul. 13, 2018.

(30) Foreign Application Priority Data

Jul. 31, 2017   (DE) .................... 10 2017 213 181.0

(51) Int. Cl.
 *G03F 7/20*   (2006.01)
(52) U.S. Cl.
 CPC .......... *G03F 7/70033* (2013.01); *G03F 7/702* (2013.01); *G03F 7/7015* (2013.01);
(Continued)

(58) Field of Classification Search
None
See application file for complete search history.

(56) References Cited

U.S. PATENT DOCUMENTS 6,664,554 B2   12/2003   Klebanoff et al.
8,247,080 B2    8/2012   Iaovangelo et al.
(Continued)

FOREIGN PATENT DOCUMENTS

DE    102008017888 A1    1/2009
DE    102008028868 A1    12/2009
(Continued)

OTHER PUBLICATIONS

International Search Report, PCT/EP2018/069137, dated Oct. 5, 2018, 6 pages.

*Primary Examiner* — Michelle M Iacoletti
(74) *Attorney, Agent, or Firm* — Edell, Shapiro & Finnan LLC

(57) ABSTRACT

An optical arrangement (1) for EUV radiation includes: at least one reflective optical element (16) having a main body (30) with a coating (31) that reflects EUV radiation (33). At least one shield (36) is fitted to at least one surface region (35) of the main body (30) and protects the at least one surface region (35) against an etching effect of a plasma (H+, H*) that surrounds the reflective optical element (16) during operation of the optical arrangement (1). A distance (A) between the shield (36) and the surface region (35) of the main body (30) is less than double the Debye length ($\lambda_D$), preferably less than the Debye length ($\lambda_D$), of the surrounding plasma (H+, H*).

15 Claims, 3 Drawing Sheets

(52) U.S. Cl.
CPC ...... *G03F 7/70916* (2013.01); *G03F 7/70925* (2013.01); *G03F 7/70941* (2013.01)

(56) References Cited

U.S. PATENT DOCUMENTS

| | | | |
|---|---|---|---|
| 8,450,706 B2* | 5/2013 | Abe | G03F 7/70033 |
| | | | 250/423 R |
| 2005/0120953 A1 | 6/2005 | Banine et al. | |
| 2007/0125964 A1 | 6/2007 | Van Herpen et al. | |
| 2007/0222964 A1* | 9/2007 | Katsuhiko | G03B 27/54 |
| | | | 355/71 |
| 2011/0188011 A1 | 8/2011 | Ehm et al. | |
| 2013/0038849 A1 | 2/2013 | Weippert | |
| 2014/0098413 A1 | 4/2014 | Ershov et al. | |
| 2014/0199543 A1 | 7/2014 | Ehm et al. | |
| 2014/0213041 A1* | 7/2014 | Lei | H01L 21/78 |
| | | | 438/462 |
| 2016/0187543 A1* | 6/2016 | Bekman | G02B 1/14 |
| | | | 359/360 |
| 2017/0276842 A1* | 9/2017 | Sarov | G03F 7/70908 |

FOREIGN PATENT DOCUMENTS

| | | |
|---|---|---|
| DE | 102009012091 A1 | 3/2010 |
| DE | 102011076011 A1 | 11/2012 |
| DE | 102012202850 A1 | 8/2013 |
| DE | 102014204658 A1 | 3/2015 |
| DE | 102015203160 A1 | 9/2015 |
| DE | 102015215014 A1 | 10/2015 |
| EP | 1065532 B1 | 3/2005 |
| EP | 1801658 B1 | 6/2016 |
| JP | 2003340959 A | 12/2003 |
| WO | 2008034582 A2 | 3/2008 |
| WO | 2013124224 A1 | 8/2013 |
| WO | WO-2016096878 A1 * | 6/2016 .......... G03F 7/70116 |

* cited by examiner

OPTICAL ARRANGEMENT FOR EUV RADIATION WITH A SHIELD FOR PROTECTION AGAINST THE ETCHING EFFECT OF A PLASMA

CROSS REFERENCE TO RELATED APPLICATIONS

This is a Continuation of International Application PCT/EP2018/069137, which has an international filing date of Jul. 13, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 213 181.0 filed on Jul. 31, 2017.

FIELD OF THE INVENTION

The invention relates to an optical arrangement for EUV radiation, comprising: at least one reflective optical element having a main body with a coating that reflects EUV radiation.

The optical arrangement for EUV radiation can be an EUV lithography apparatus for the exposure of a wafer, or some other optical arrangement that uses EUV radiation, for example an EUV inspection system, e.g. an arrangement for measuring or for inspecting masks, wafers or the like used in EUV lithography.

BACKGROUND

On account of the low transmission of practically all known materials for radiation in the EUV wavelength range, in an EUV lithography apparatus both the illumination system thereof and the projection optical unit thereof typically contain exclusively reflective optical elements, in particular in the form of mirrors. The mirrors used therein have a main body, also referred to as substrate. A coating is applied to the main body in order to reflect the EUV radiation. The reflective coating can be applied directly to the material of the main body, but it is also possible for one or more functional layers used for example for protecting the substrate or as adhesion promoter to be arranged between the reflective coating and the material of the main body.

During operation, the reflective optical element heats up, potentially even to a great extent, as a result of the incident and partly absorbed EUV radiation, but the optically effective region of the reflective coating, i.e. that region on which the EUV radiation is incident, is intended not to be altered in its shape. The material of the main body of a reflective optical element for EUV lithography is therefore typically chosen such that it has a low coefficient of thermal expansion and/or a good thermal conductivity.

Typical materials used for the main body are quartz glass, in particular titanium-doped quartz glass, which is offered e.g. under the trade name ULE®, and also (pure) silicon or aluminum, optionally with an (amorphous) silicon coating. The coating that reflects EUV radiation and contains the optically effective region is applied to the main body (and/or optionally to functional layers such as the amorphous silicon coating).

The residual gas present in the vicinity of the reflective optical elements likewise absorbs the EUV radiation and therefore reduces the transmission of the EUV radiation upon passing through the optical arrangement. For this reason, optical arrangements for EUV lithography are typically operated under vacuum conditions. The residual gas present in the vacuum environment of such an optical arrangement can be admixed with small quantities of hydrogen and/or of other reactive gases which can provide a protective effect for the reflective optical elements and which exhibit only little absorption for the EUV radiation.

During operation of the EUV lithography apparatus, a hydrogen plasma typically forms in such a vacuum environment under the influence of the EUV radiation, that is to say that activated hydrogen in the form of hydrogen ions and hydrogen radicals is formed. On account of the etching attack—caused by the activated hydrogen—on uncovered, generally uncoated, surfaces of materials or of components in optical arrangements for EUV lithography, etching products can form, which undergo transition to the gas phase and are released into the vacuum environment. Etching products of this type can deposit at the surfaces of the reflective optical elements, in particular in the optically used region. As a result of these deposits, the optical arrangement loses transmission for the EUV radiation and hence performance and productivity.

DE 10 2015 203 160 A1 describes an optical arrangement for EUV lithography which comprises an opening channel between a vacuum chamber interior, in which an optical element is arranged and into which a hydrogen feed device leads, and a housing interior, in which a component that outgasses contaminating substances upon contact with activated hydrogen is arranged. The opening channel has an inner wall with a coating formed thereon, said coating containing a material having a hydrogen recombination coefficient of 0.08 or higher in order to reduce the inflow rate of activated hydrogen.

US 2007/0125964 A1 has disclosed an EUV lithography apparatus comprising a cleaning device configured to provide a flow of hydrogen radicals. In one exemplary embodiment, at least one part of the cleaning device which is exposed to hydrogen radicals comprises a material having a surface recombination coefficient for hydrogen radicals of less than or equal to 0.02.

WO 2008/034582 A1 describes an optical arrangement comprising at least one vacuum housing, in which at least one optical element is arranged. The vacuum housing is assigned a contamination reducing device, which reduces the partial pressure of contaminating substances in the vicinity of the optical element. The vacuum housing can serve as a contamination reducing device and, on its inner side, can comprise at least one gas-binding material, for example Ti, Ta, Nb, Zr, Th, Ba, Mg, Al, Yb, Ce.

DE 10 2015 215 014 A1 describes an EUV projection exposure apparatus comprising a housing which defines an interior. Hydrogen ions and/or hydrogen radicals can arise in the interior during operation. The EUV projection exposure apparatus comprises a multiplicity of components which at least partly are accommodated in the interior and which at least partly comprise a layer composed of a noble metal, for example composed of Rh, Ru, Ir, Pd, Pt. The minimum layer thickness of the layer is chosen such that hydrogen ions and/or hydrogen radicals cannot penetrate through the layer.

It is known to use protective layers or protective coatings for reflective optical elements in the form of capping layers applied as topmost layers to a reflective coating in order to protect underlying layer(s) against contamination.

U.S. Pat. No. 6,664,554 B2 describes a self-cleaning reflective optical unit for EUV lithography comprising a metal formed on the surface of the optical unit, said metal protecting the optical unit against oxidation and transmitting substantially the entire incident radiation to the underlying optical surface. The metal can form a capping layer comprising at least one material selected from the group comprising: Ru, Rh, Pd, Ir, Pt, Au and compositions thereof.

DE 10 2011 076011 A1 describes a reflective optical element having a reflective surface and a multilayer system, wherein the reflective surface has a protective layer system comprising a topmost layer composed of silicon carbide or ruthenium, wherein the protective layer system has a thickness of between 5 nm and 25 nm. DE 10 2012 202 850 A1 describes an optical element in which the topmost layer of a protective layer system comprises a material selected from a group of chemical compounds comprising: Oxides, carbides, nitrides, silicates and borides, in particular of the following chemical elements: Y, Ce, Zr, Nb, Si, Ti, V, Mo, Mn, Al, W, Cr, La, Co, Ru, B, Hf, U, Be.

Protective layers or protective coatings composed of different materials for reflective optical elements for EUV lithography have also been disclosed by US 2014/0098413 A1. Their topmost layer can be formed from ZrN, $Y_2O_3$ or $Al_2O_3$, for example. EP 1 801 658 B1 has disclosed a capping layer composed of diamond-like carbon for a reflector having a multilayer coating. EP 1 065 532 B1 has also disclosed a capping layer for a reflector, the material of said capping layer being selected from a group comprising diamond-like carbon, BN, $Si_3N_4$, SiC, B, Ru, Rh and compounds and alloys thereof.

US 2013/0038849 A1 has disclosed an optical component for the transmission of radiation, said optical component comprising a radiation protective layer composed of at least one oxide material. An adhesive layer or a fluid-repelling layer, in particular a hydrophobic layer, can be applied to the radiation protective layer.

U.S. Pat. No. 8,247,080 B2 describes a coating structure comprising an outer coating comprising aluminum, and also an interlayer between a substrate and the outer coating. The interlayer can comprise a rare earth metal, a transition metal and/or a noble metal. The substrate can comprise a metal nitride, a metal carbide, a metal boride and/or a metal oxide. The interlayer can be less reactive than the outer coating vis à vis etching with halogens.

SUMMARY

It is an object of the invention to provide an optical arrangement for EUV radiation comprising at least one reflective optical element which is protected against the etching effect of a surrounding plasma, in particular of a hydrogen plasma.

This object is achieved, according to one formulation, by an optical arrangement of the type mentioned in the introduction in which at least one shield is fitted to at least one surface region of the main body and protects the at least one surface region against an etching effect of a plasma that surrounds the reflective optical element during operation of the optical arrangement, wherein a distance between the shield and the protected surface region of the main body is less than double the Debye length, preferably less than the Debye length, particularly preferably less than one third of the Debye length, of the surrounding plasma.

As a result of the etching effect of the (hydrogen) plasma, in particular in the form of activated hydrogen, i.e. hydrogen ions and/or hydrogen radicals, the material of the main body can be at least partly removed in the surface regions at which the main body is exposed to the surrounding plasma. Etching products formed in the process can pass into the vacuum environment and deposit on the reflective coating, as a result of which the reflectivity of the optical element decreases.

In conventional optical elements, uncovered, typically uncoated, surfaces of the material of the main body and of functional coatings optionally applied to the main body outside the reflective coating are afforded no dedicated protection against an etching attack. The inventors propose protecting the material of the main body (or optionally of a functional coating applied thereto) in at least one surface region, outside the optically used surface region, in particular outside the reflective coating, against an etching attack and thus against partial material removal using at least one shield.

In order to ensure effective protection of the uncovered surface region or surface region to be protected, it is advantageous if the shield is arranged at the smallest possible distance from the protected surface region. The smaller the distance between the shield and the surface region, the greater typically the protective effect of the shield. The main body does not have to be protected against the surrounding plasma in surface regions at which said main body is not exposed to the plasma, for example because said main body is connected to a mount or the like over the whole area at its rear side, for example.

A gap can be formed between the shield and the main body, but it is also possible for the shield to be applied to the main body indirectly or directly, as will be described in greater detail further below. In particular, a shield of the type of a screen spaced apart from the main body can be combined with a (further) shield applied to the main body indirectly or directly. In any case, for achieving a protective effect that is as effective as possible, the distance of the shield should be less than the Debye length of the surrounding plasma.

In one embodiment, the shield is formed by a screen separated from the surface region of the main body by a gap. In this embodiment, the shield is formed by an integral or multipartite mechanical screen, i.e. the shield is a self-supporting component. Two or more shields in the form of screens spaced apart from one another can be provided at the reflective optical element in order to cover different surface regions. As has been described further above, the width of the gap and thus the distance between the screen and the protected surface region should be less than the Debye length of the surrounding plasma.

In one development, the screen, at least at a side facing the gap, has a coating composed of a hydrogen recombination material or the screen consists of a hydrogen recombination material. Within the meaning of this application, a hydrogen recombination material is understood to mean a material which has a hydrogen recombination coefficient of 0.08 or higher, i.e. which has a high recombination rate $H^+ \rightarrow H^*$ and in particular $H^* \rightarrow H_2$. In this case, the hydrogen recombination coefficient is as defined in the literature cited in US 2007/0125964 A1, cf. in particular also Table 1 of US 2007/0125964 A1, which indicates the surface hydrogen recombination coefficient $\gamma$ for various materials. In this case, the screen itself can be formed from a mechanically preferred material, for example from specific Al or Ti alloys, to which the coating is applied. The material of the screen itself can also optionally be formed from a hydrogen recombination material having a hydrogen recombination coefficient of 0.08 or higher.

In one advantageous development, the hydrogen recombination material forms a contamination getter material selected for example from the group comprising: Ir, Ru, Pt, Pd. Particularly suitable materials for the screen and/or for the coating are those which, in addition to a high hydrogen recombination rate, can function as getter surface or as getter material, i.e. as sacrificial layer, for etching products possibly still arising and thus additionally reduce a contamination of the reflective optical element. Examples of such materials are, inter alia, Ir, Ru, Pt, Pd.

In a further embodiment, the gap is filled at least partly, in particular completely, with a filling material. The filling material can serve as a spacer in order to keep the screen at a distance from the surface region which is less than double the Debye length. The filling material additionally protects the space or the gap between the surface region and the screen against contamination. The filling material can completely fill the gap and can be embodied for example in the manner of a platelet or of a plate-like component, for example of a plate-like component extending circumferentially in a ring-shaped fashion. However, it is not absolutely necessary for the filling material to completely fill the gap. The filling material can be embodied in a structured fashion, for example, i.e. fill only partial regions of the gap. For fulfilling the function as a spacer, it is necessary for the filling material at least locally to bridge the gap, for example in the form of webs. The structuring of the filling material can be achieved with a local deposition of the filling material on the surface region, for example in the form of a coating. An areal coating of the surface region with the filling material is also possible. In this case, a structuring can be produced by local etching, i.e. targeted local removal of the coating.

In one embodiment, the filling material is selected from the group comprising: Aluminum oxide, zirconium nitride, yttrium oxide, cerium oxide, zirconium oxide, niobium oxide, titanium oxide, tantalum oxide, tungsten oxide, metals, preferably noble metals, in particular Ru, Rh, Pd, Ir, Pt, Au, and compositions thereof. Filling materials used can be, in particular, materials which are applied as protective layers or as capping layers to the reflective coating of the optical element in order to protect underlying layers of the reflective coating against contamination.

In a further embodiment, the screen has at least one screen section projecting at least partly over the reflective coating, applied to the main body, outside an optically used region. The protective effect of the shield or the screen against ion etching can be increased further by the over-projecting screen section, since the over-projecting screen section prevents the ions and/or radicals from penetrating into the gap between the rest of the screen and the protected surface region or surface region to be protected. The protected surface region can be formed for example at a side surface of the main body and the over-projecting screen section can project over the main body at its front side, at which the reflective coating is formed. In this case, the over-projecting screen section is typically adjoined by a screen section extending along the side surface of the main body. In particular, it is advantageous if the over-projecting screen section prevents the formation of a direct line of sight between an environment in which the plasma is present and the protected surface region, for example in the form of the side surface.

In one development, the screen section projects over the reflective coating over a length that is greater than the gap between the shield and the surface region to be protected of the main body. Typically, the length covered by the over-projecting screen section is significantly greater than the gap between the screen and the surface region of the main body which is intended to be protected against the etching attack. The length of the over-projecting screen section can be in particular more than 10 times, more than 20 times or more than 50 times the width of the gap. The penetration of ions or radicals into the gap between the shield and the surface region to be protected can be prevented particularly effectively in this way.

In a further embodiment, the shield is applied directly to the surface region of the main body. In this case, the shield can be embodied as a coating comprising at least one layer applied directly to the main body. The at least one layer or, in the case of a plurality of layers, the topmost layer of the coating should be formed from a material that is insensitive via a vis an etching attack. Particularly suitable materials are those which, in addition to their resistance to etching, have a high recombination capability for hydrogen radicals, with a result that they provide protection in two respects. Examples of such materials are Ru, Rh, Ir, Pt, Au, Ni, Ti, Cu, $Al_2O_3$, Pd, Ag, W, . . . .

Besides the choice of a suitable material of the layer(s), it is necessary for the shield in the form of the coating to ensure a sufficiently high coverage of the exposed surface of the main body, such that (approximately) no hydrogen ions can penetrate as far as the material of the main body. The necessary coverage is greatly dependent on the layer material and the surface constitution of the material to be protected of the main body. In order to provide sufficient protection against an etching attack, the coverage should be at least 80%, preferably at least 97%, ideally at least 99.99%, i.e. a corresponding proportion of hydrogen ions and/or hydrogen radicals should be kept away from the protected surface region of the main body by the coating. Depending on the coating technology employed, the required coverage of the substrate surface also determines the minimum required layer thickness of the shield which should be applied to the surface region to be protected. Minimum layer thicknesses are typically in the range of approximately 50 nm or less.

In one development, the shield in the form of the coating has at least two layers, the layer stresses of which at least partly compensate for one another, and/or the shield in the form of the coating has a periodic sequence of layers composed of a first material and a second material. The type of (intrinsic) layer stress, i.e. the presence of a tensile stress or a compressive stress, depends not only on the material of the respective layer, but also on the way in which the layers are produced, cf. for example the article "Intrinsic Stress in Sputter-Deposited Thin Films" by H. Windischmann, Critical Reviews in Solid State and Materials Sciences, 17:6, 547-596 or the article "Achieving zero stress in iridium, chromium, and nickel thin films", D. M. Broadway et al., Proceedings of the SPIE, Volume 9510, id. 95100E 15 pp. (2015).

However, materials also exist which, on account of their properties, e.g. their density, are associated with intrinsic tensile stresses or with intrinsic compressive stresses. Appropriate examples for first layers having an intrinsic tensile stress are copper, silver, gold, chromium or a nickel-chromium alloy, wherein the ratio of chromium to nickel here is typically between 30:70 and 70:30 (% by weight). By way of example, ruthenium or silicon can be used as material for a second layer having a compressive stress. The coating typically comprises at least one first layer having an intrinsic tensile stress and at least one second layer having an intrinsic compressive stress. The coating can also comprise a periodic sequence of first layers having an intrinsic tensile stress and second layers having an intrinsic compressive stress. The absolute value of the layer stress changes non-linearly with the thickness and other factors also influence the resulting layer stress. A periodic sequence of layers has proved to be advantageous in order to set the resulting layer stress of the coating more precisely. Moreover, occasionally separating barrier layers composed of a second material are advantageous if (as in the case of molybdenum) the layer stress changes sign starting from a certain thickness.

In one development, the shield in the form of the coating has a maximum thickness of less than 500 nm, in particular of less than 200 nm. The maximum thickness of the shield in the form of the coating is defined by the requirements in respect of the layer stress and the layer adhesion resulting therefrom and also by the surface constitution of the surface region to be coated. A maximum thickness of the layer or of the shield is in the range of hundreds of nanometers, preferably less than 200 nm, for example in the case of ruthenium as layer material on a polished surface of a protected surface region.

The layer stress of the coating forming the shield can be chosen such that the coating does not alter (significantly) the figure, i.e. the surface shape, of the main body, with the result that the imaging properties of the optical arrangement remain (substantially) unchanged. This can be achieved for example by: a) having available the alteration of the figure established in line with expectations during the processing of the main body of the reflective optical element before the coating is applied, b) correcting the actually established alteration of the figure after the shield in the form of the coating has been applied, for example using a so-called integrated correction asphere (ICA), i.e. by altering the figure or the surface shape of a (different) reflective optical element in the form of a correction asphere, c) adapting the combination of layer stress and layer thickness of the coating in such a way that the figure of the reflective optical element is not significantly changed, d) suitably selecting surface regions to be coated with regard to the effects on the change in figure and applying the coating only on surface regions that are as insensitive as possible visa vis coating effects. The material of the coating or of the layers should be stable over the lifetime of the optical arrangement.

In one development, the shield in the form of the coating comprises at least two layers, the layer stresses of which preferably compensate for one another at least partly, ideally completely. In addition to an outer layer, which is exposed to the surrounding plasma, the shield in the form of the coating can comprise at least one further, underlying layer, the layer stress of which compensates for the layer stress of the outer layer as completely as possible. Examples of materials which generally have a stress-compensating effect are nickel silicide (NiSi), tungsten boron carbide (WB4C), etc. The possibility of adjusting the layer stress in the shield in a targeted manner by way of at least one stress-compensating layer enables even greater layer thicknesses than described further above to be realized. The shield in the form of the coating can have in particular a periodic sequence of layers composed of a first material and composed of a second material. This simplifies the compensation of the layer stresses.

Besides the function of protecting the surface region of the main body against hydrogen etching, the shield in the form of the coating can also fulfil further functions. By way of example, with the use of materials having a high absorption for EUV radiation, in a targeted manner unwanted EUV radiation or EUV stray light can be absorbed and thus filtered out of the beam path. Suitable layer materials having a high absorption for EUV radiation are likewise NiSi, WB4C, etc.

Various thin-film coating methods can be used for coating a surface region with a coating comprising at least one layer having the properties mentioned above. Directional coating methods such as electron beam evaporation and/or ion beam sputtering are preferably used for applying the layer(s) of the shield. However, nondirectional coating methods such as magnetron sputtering or atomic layer deposition (ALD) are also possible. An electrolytic layer deposition or so-called "spray coating" is also possible for applying comparatively thick layers.

The coating process for applying the shield in the form of the coating to the protected surface region should be configured in such a way that the performance of the reflective coating is not impaired by the application of the shield. In order to achieve this, the shield can be implemented for example in the process sequence before the reflective coating and with protection of that surface region of the main body to which the reflective coating is applied. This protection can be ensured for example by a mechanical screen, a protective lacquer or a protective foil. An opposite process order is also possible, wherein the reflective coating is applied first. In this case, a mechanical screen can protect the reflective coating during the application of the coating serving as a shield against the surrounding plasma. The mechanical screen used for this purpose is spaced apart from the main body. The first process order is preferred here since, in this case, the main body has not yet experienced the full added value in the application of the coating serving as a shield.

In a further, alternative embodiment, the shield forms a protective film connected indirectly to the protected surface region of the main body. In this embodiment, the shield is formed by a protective film, i.e. by one or more protective foil(s). The protective film is typically formed from a material which is insensitive to etching attack and which is ideally impermeable to hydrogen ions, such that the latter cannot penetrate as far as the surface region protected by the protective film. The protective film or the protective foil is (areally) connected to the protected surface region by a permanently stable, indirect connection, i.e. no gap is formed between the protective film and the protected surface region.

In one development, a connecting material for cohesively connecting the protective film to the main body is introduced between the protective film and the protected surface region. In this case, the protective film is formed from one or more component parts applied to the protected surface regions using a suitable connecting material. As a result of the indirect securing, given a suitable choice of the material of the protective film and defect-free contacting of the main body, a high protective effect is achieved since ions or a (hydrogen) plasma are/is prevented from making contact with the protected surface. When applying the protective film, care should be taken to ensure that at least the optically used region formed at the reflective coating is not covered by the protective film.

The indirect, cohesive connection of the protective film to the protected surface(s) can be produced by an adhesive connection, for example, with other joining methods also being possible.

In order to prevent a transfer of stresses to the optical element to be protected or to the main body to the required extent, the connecting medium or the connecting material should exhibit very low stress. In the case of adhesive connections, this can be achieved for example by the use of a double-sided adhesive tape, wherein the shrinkage (as a result of the outdiffusion of water) is usually less than 0.5%. The indirect, typically cohesive connection should moreover be insensitive to the prevailing ambient conditions.

In a further embodiment, the protective film has a maximum thickness of less than 50 µm, preferably of less than 20 µm. The shield in the form of the protective film should be as flexible as possible in order to produce a stable, permanent connection to the connecting material or to the main body and to transfer only negligibly low stresses to the main body. Such a small thickness is advantageous particularly in the case of metallic materials since the latter are possibly not flexible enough in the event of their being applied with a larger thickness. The protective film or its material should moreover be as insensitive as possible to the ambient conditions.

In one embodiment, the Debye length of the surrounding plasma is less than 5 mm, preferably less than 0.5 mm, in particular less than 0.1 mm. The Debye length, also referred to as shielding length, constitutes that characteristic length $\lambda_D$ over which the electrical potential of a local excess charge decreases in magnitude by 1/e. At equilibrium the Debye length $\lambda_D$ is constituted from the electron Debye length $\lambda_{De}$ and the ion Debye length $\lambda_{Di}$ in accordance with the following formula: $1/\lambda D^2=1/\lambda_{De}^2+1/\lambda_{Di}^2$. The two elements $\lambda_{Di}$ and $\lambda_{De}$ are dependent on the particle density of the electrons and on the temperature of the electrons and on the temperature of the ions, respectively, which are in turn dependent on the local conditions of the plasma in the environment of the optical element.

In a further embodiment, the material of the shield is selected from the group comprising: metallic materials, in particular Cu, Co, Pt, Ir, Pd, Ru, Al, W, Ta, high-grade steel and ceramic materials, in particular $AlO_x$, $Al_2O_3$. For the realization of a protective film that is as insensitive as possible to the surrounding plasma, the use of metallic or ceramic materials or substances has proved to be advantageous. Metallic or ceramic materials, in particular in the form of the materials indicated above, have also proved to be advantageous for the production of shields in the form of a mechanical screen or in the form of a coating, in particular a topmost layer of a coating.

In a further embodiment, the main body comprises at least one material selected from the group comprising: Quartz glass, titanium-doped quartz glass, glass ceramic, (pure) silicon, aluminum, copper, silicon-containing, aluminum-containing and/or copper-containing alloys, compounds or composites, in particular aluminum or copper with a (typically amorphous) silicon coating. As has been described further above, materials having a low coefficient of thermal expansion, e.g. in the form of titanium-doped quartz glass, are used in particular for reflective optical elements arranged in the projection lens.

In the illumination system of an EUV lithography apparatus, the requirements in respect of the stability of the components used therein visa vis thermal expansion are generally less stringent, and so for the reflective optical elements arranged in the illumination system, as main body, materials such as e.g. silicon, copper or aluminum can be used, to which, if appropriate, an (amorphous) silicon coating is applied. In this case, the amorphous silicon coating is ideally covered completely by the reflective coating.

What the main body materials mentioned further above have in common is that they contain silicon, which is typically etched by the surrounding plasma, particularly if the latter contains hydrogen ions and/or hydrogen radicals. In this case, the formation of readily volatile substances such as e.g. $SiH_3$, $SiH_4$ can occur, in which case the Si contained therein can deposit within the optically used region of the reflective optical element and therefore reduces the reflectivity of the optical element. However, the problem of ion etching is not limited to main bodies composed of the materials described further above, but rather can also occur in the case of uncovered surface regions of main bodies composed of other materials.

The optical arrangement can comprise an EUV light source for generating EUV radiation, an illumination system for illuminating a structured object with the EUV radiation of the EUV light source, and a projection lens for imaging the structured object onto a substrate. In this case, the optical arrangement is an EUV lithography apparatus.

In one development, the reflective optical element is a collector mirror for focusing the EUV radiation of the EUV light source or a reflective optical element, adjacent to the structured object, of the illumination system.

The collector mirror is a reflective optical element that is typically operated with normal incidence ("normal incidence mirror"), i.e. with comparatively small angles of incidence relative to the surface normal. In this case, the reflective coating can be configured as a multilayer coating which acts as an interference layer system for an operating wavelength of the EUV lithography apparatus. By way of example, the multilayer coating can comprise alternating layers of molybdenum and silicon.

The optical element arranged adjacent to the structured object can be a reflective optical element configured for grazing incidence ("grazing incidence mirror"). A reflective optical element of this type is typically configured for the reflection of radiation at an angle of incidence which is greater than 60 degrees, is greater than 65 degrees or is greater than 70 degrees relative to the surface normal. Other reflective optical elements of the optical arrangement or of the EUV lithography apparatus which are configured for normal or for grazing incidence can also be provided with one or with a plurality of shields in order to protect their uncovered surface regions against an etching effect of the surrounding plasma.

Further features and advantages of the invention are evident from the following description of exemplary embodiments of the invention, with reference to the figures of the drawing, which show details essential to the invention, and from the claims. The individual features can be realized in each case individually by themselves or as a plurality in any desired combination in a variant of the invention.

BRIEF DESCRIPTION OF THE DRAWINGS

Exemplary embodiments are illustrated in the schematic drawing and are explained in the following description. In the figures.

DETAILED DESCRIPTION

In the following description of the drawings, identical reference signs are used for identical or functionally identical components.

Figure 1:
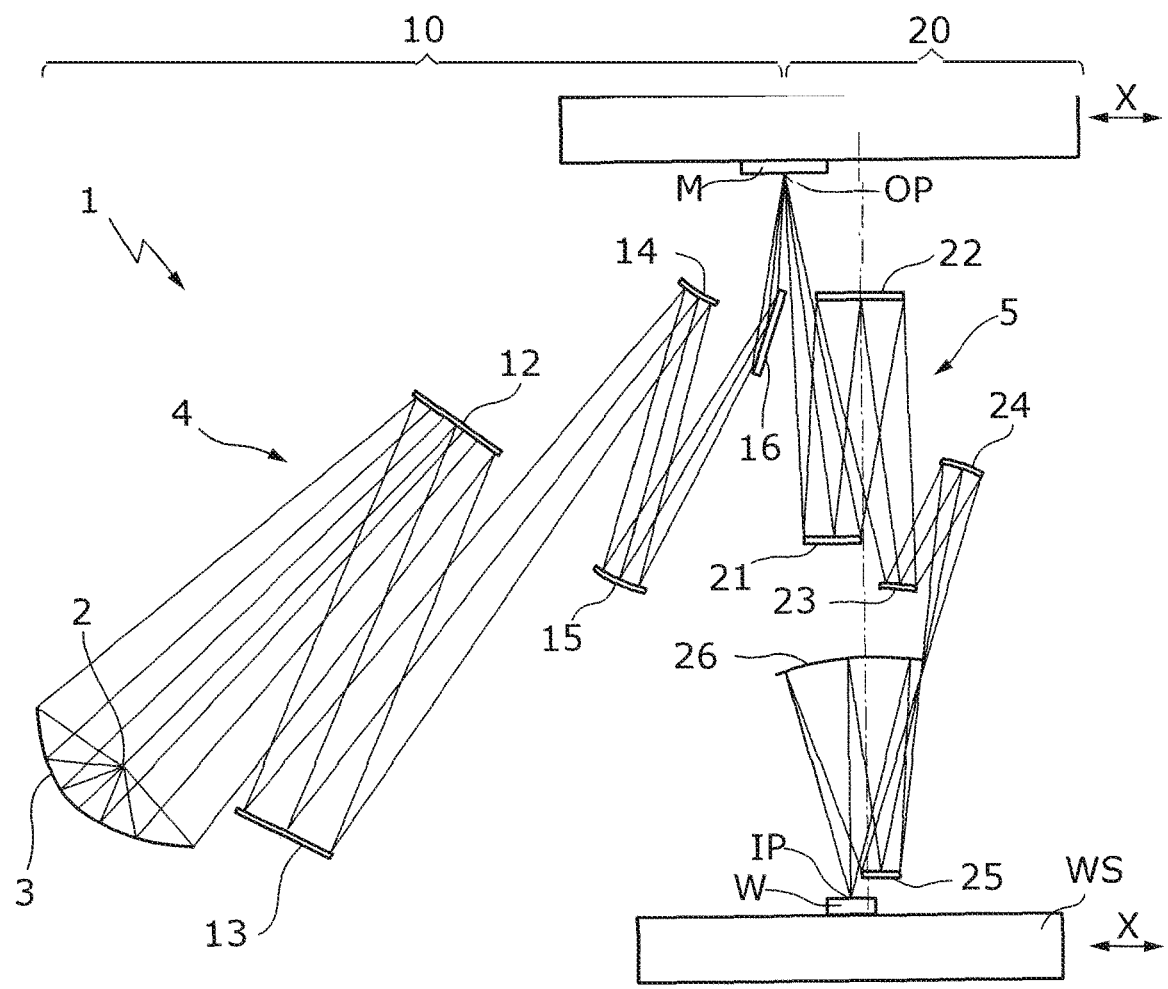
FIG. 1 shows a schematic illustration of an optical arrangement in the form of an EUV lithography apparatus.

FIG. 1 schematically shows the construction of an optical arrangement for EUV lithography in the form of an EUV lithography apparatus 1, specifically of a so-called wafer scanner. The EUV lithography apparatus 1 comprises an EUV light source 2 for generating EUV radiation, which has a high energy density in the EUV wavelength range below 50 nanometers, in particular between approximately 5 nanometers and approximately 15 nanometers. The EUV light source 2 can be configured for example in the form of a plasma light source for generating a laser-induced plasma. The EUV lithography apparatus 1 shown in FIG. 1 is designed for an operating wavelength of the EUV radiation of 13.5 nm. However, it is also possible for the EUV lithography apparatus 1 to be configured for a different operating wavelength in the EUV wavelength range, such as 6.8 nm, for example.

The EUV lithography apparatus 1 furthermore comprises a collector mirror 3 in order to focus the EUV radiation of the EUV light source 2 to form an illumination beam 4 and to increase the energy density further in this way. The illumination beam 4 serves for the illumination of a structured object M by an illumination system 10, which in the present example has five reflective optical elements 12 to 16 (mirrors).

The structured object M can be for example a reflective photomask, which has reflective and non-reflective, or at least much less reflective, regions for producing at least one structure on the object M. Alternatively, the structured object M can be a plurality of micro-mirrors, which are arranged in a one-dimensional or multi-dimensional arrangement and which are possibly movable about at least one axis, in order to set the angle of incidence of the EUV radiation on the respective mirror.

The structured object M reflects part of the illumination beam 4 and shapes a projection beam path 5, which carries the information about the structure of the structured object M and is radiated into a projection lens 20, which generates a projected image of the structured object M or of a respective partial region thereof on a substrate W. The substrate W, for example a wafer, comprises a semiconductor material, for example silicon, and is arranged on a mounting, which is also referred to as a wafer stage WS.

In the present example, the projection lens 20 has six reflective optical elements 21 to 26 (mirrors) in order to generate an image of the structure that is present on the structured object M on the wafer W. The number of mirrors in a projection lens 20 typically lies between four and eight; however, only two mirrors can also be used, if appropriate.

In order to achieve a high imaging quality in the imaging of a respective object point OP of the structured object M onto a respective image point IP on the wafer W, extremely stringent requirements are to be made in respect of the surface shape of the mirrors 21 to 26; and the position or the alignment of the mirrors 21 to 26 in relation to one another and in relation to the object M and the substrate W also requires precision in the nanometer range.

Figure 2A:
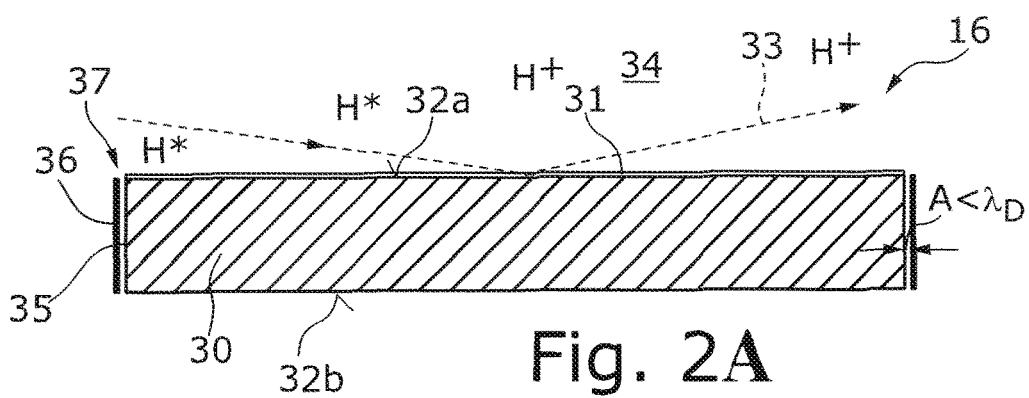
FIGS. 2A-2C show, respectively, a first, a second and a third schematic sectional illustration of a reflective optical element with a shield in the form of a screen for protecting a lateral surface region of the main body against the etching effect of a surrounding plasma.
Figure 2B:
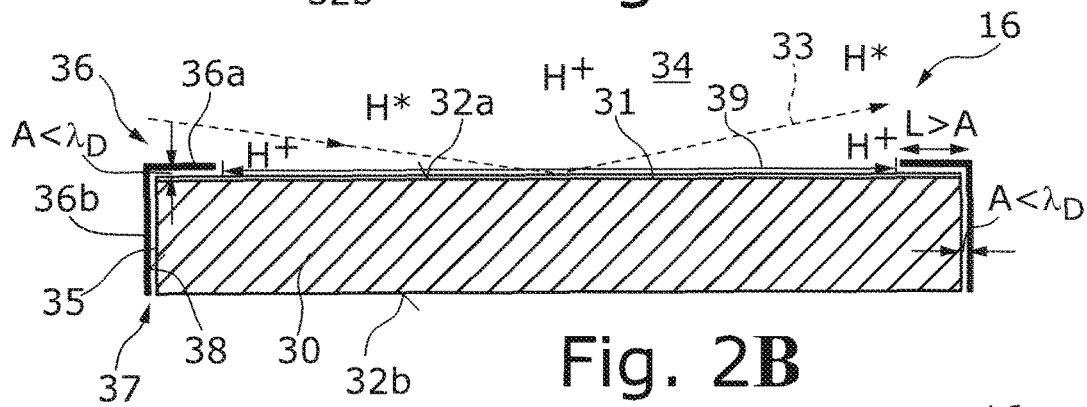
Figure 2C:
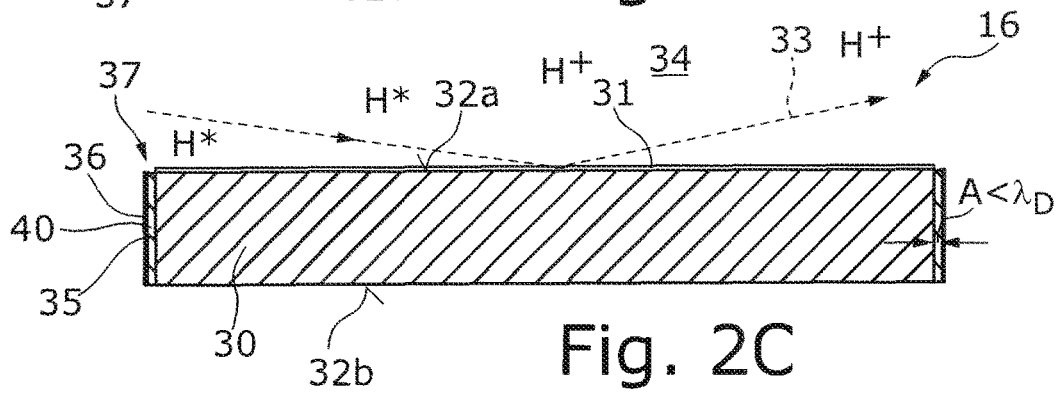

FIGS. 2A-2C show respective sectional illustrations of the fifth optical element 16 of the illumination system 10, which comprises a main body 30 composed of aluminum, said main body being of integral design in the example shown. The main body 30 can also be formed from silicon, from copper or from a silicon-containing, aluminum-containing or copper-containing material. The main body 30 serves as a substrate for a reflective coating 31 applied to a planar front side 32a of the main body 30. At its rear side 32b, which is likewise planar, the main body 30 is areally applied to a mounting, not illustrated pictorially in FIGS. 2A-2C. The reflective optical element 16 is illustrated in a greatly simplified manner in FIGS. 2A-2C, and that said reflective optical element has a more complex geometry in practice.

In the respective examples shown in FIGS. 2A-2C, the reflective coating 31 is configured for reflecting EUV radiation 33 incident with grazing incidence on the front side 32a of the main body 30, i.e. for EUV radiation 33 incident on the front side 32a of the main body 30 at an angle of incidence of more than approximately 60°. In the example shown, the reflective coating 31 is formed by a single layer, but can also be formed by a multilayer system.

As is likewise evident in FIGS. 2A-2C, the reflective optical element 16 is exposed to a hydrogen plasma in the form of hydrogen ions H⁺ and hydrogen radicals H* that is produced in a vacuum environment 34, in which the reflective optical elements 3, 12 to 16 of the illumination system 10 and the reflective optical elements 21 to 26 of the projection lens 20 are arranged.

While the front side 32a and the rear side 32b of the main body 30 are protected against the hydrogen plasma H⁺, H* by the reflective coating 31 and respectively by the mounting, not illustrated pictorially, this is not the case for the circumferential side surface of the main body 30, with the result that said side surface forms a lateral surface region 35 that is exposed to the hydrogen plasma H⁺, H* in the environment of the reflective optical element 16.

In order to protect the lateral surface region 35 against an etching effect of the hydrogen plasma H⁺, H*, in the respective examples shown in FIGS. 2A-2C, a shield in the form of a screen 36 is provided at the reflective optical element 16. For this purpose, the screen 36 covers the lateral surface region 35 of the reflective optical element 16 at a defined distance A with formation of a gap 37, whose gap width (which is constant in the examples shown) corresponds to the distance A between the screen 36 and the lateral surface region 35.

In order to achieve the best possible protective effect for the lateral surface region 35 of the reflective optical element 16, the distance A between the protected surface region 35 of the reflective optical element 16 and the shield 36 should be as small as possible. In particular, the distance A should be less than double the Debye length $\lambda_D$, in particular less than the Debye length $\lambda_D$, of the surrounding plasma H⁺, H*, which is less than 5 mm, less than 0.5 mm or less than 0.1 mm in the examples shown.

The shield in the form of the screen 36 is formed from a metallic material in the form of high-grade steel in the example shown in FIG. 2A. Other materials that are comparatively insensitive to an etching attack, in particular metallic or ceramic materials, can also be used as materials for the screen 36. By way of example, the screen 36 can be formed from copper (Cu), cobalt (Co), platinum (Pt), iridium (Ir), palladium (Pd), ruthenium (Ru), aluminum (Al), tungsten (W), tantalum (Ta) or a ceramic material, in particular AlOx or $Al_2O_3$. The material of the screen 36 typically has a greater resistance to the etching effect of a (hydrogen) plasma than the material of the main body 30.

In the example shown in FIG. 2B, the screen 36, at a side facing the gap 37, has a coating 38 formed from a hydrogen recombination material. A hydrogen recombination material is understood to mean a material having a hydrogen recombination coefficient of 0.08 or higher. In the example shown, the hydrogen recombination material from which the coating 38 is formed is ruthenium. Ruthenium has firstly a high resistance to hydrogen etching and secondly a high recombination capability for hydrogen radicals H* and/or for hydrogen ions H⁺. In addition, an Ru surface of the screen acts as getter surface or as getter material, i.e. as a sacrificial layer for etching products that possibly still do arise, and in this way additionally reduces the contamination of the lateral surface region. The use of Ru or of other getter materials, e.g. of Ir, Pt, Pd, for the coating 38 thus provides protection in multiple respects for the lateral surface region 35 and for the reflective coating 31.

In the example shown in FIG. 2B, the screen 36 not only covers the lateral surface region 35 of the main body 30, but additionally has an over-projecting screen section 36a, which screen section extends along the front side 32a of the main body 30, specifically likewise at a distance A which, in the example shown, is less than the Debye length $\lambda_D$ of the surrounding plasma H⁺, H*. The over-projecting screen section 36a thus also partly projects over the reflective coating 31, applied to the whole area of the front side 32a of the main body 30, and likewise at least partly covers a circumferential edge formed at the transition between the front side 32a of the main body 30 and the lateral surface region 35.

The over-projecting screen section 36a can effectively prevent the hydrogen plasma, to put it more precisely hydrogen ions H⁺ and hydrogen radicals H*, from penetrating into the gap 37. For this purpose, it is advantageous if the over-projecting screen section 36a has a length L that is greater, in particular significantly greater, than the distance A between the lateral surface region 35 and a laterally extending section 36b of the screen 36. For the length L of the over-projecting screen section 36a, the following can hold true, in particular: L>10 A, L>20 A or L>50 A. In this case, it is advantageous, in particular, if the distance A between the over-projecting screen section 36a and the front side 32a of the main body 30 is additionally also less than the Debye length or double the Debye length $\lambda_D$. As is likewise evident in FIG. 2B, the over-projecting screen section 36a is applied outside an optically used region 39 of the reflective coating 31. The beam path of the EUV radiation 33 lies within the optically used region 39, which beam path is not intended to be shielded by the screen 36.

In the example shown in FIG. 2C, as in the example shown in FIG. 2A, the screen 36 does not have an over-projecting screen section 36a. In contrast to the example shown in FIG. 2A, however, a filling material 40 is introduced in the gap 37, said filling material completely filling the gap 37. The filling material 40 serves as a spacer to keep the screen 36 at the distance A from the lateral surface region 35. The filling material 40 can be embodied for example as a plate-like component part extending circumferentially in a ring-shaped fashion around the lateral surface region 35. The filling material 40 can optionally be permanently connected to the lateral surface region 35 and/or to the screen 36. By way of example, the filling material 40 can be deposited on the lateral surface region 35. However, such a permanent connection of the filling material 40 to the lateral surface region 35 and/or to the screen 36 is not absolutely necessary.

As an alternative to the example shown in FIG. 2C, the gap 37 can be only partly filled with the filling material 40. By way of example, in this case the filling material 40 can be introduced into the gap 37 in a structured manner and can be deposited e.g. only locally, i.e. only at specific locations, on the lateral surface region 35. In this way it is possible to form web-shaped structures, for example, which bridge the gap 37. For the case where the screen 36 is embodied as illustrated in FIG. 2B, i.e. has an over-projecting screen section 36a, the filling material 40 can be introduced for example only between the lateral surface region 35 and the laterally extending section 36b of the screen 36, but not between the front side 32a and the over-projecting section 36a of the screen 36.

A material suitable for protecting the gap 37 between the lateral surface region 35 and the screen 36 against contamination is chosen as filling material 40. The filling material can be selected for example from the group comprising: Aluminum oxide, zirconium nitride, yttrium oxide, cerium oxide, zirconium oxide, niobium oxide, titanium oxide, tantalum oxide, tungsten oxide, metals, preferably noble metals, in particular Ru, Rh, Pd, Ir, Pt, Au, and compositions thereof.

Figures 3A, 3B:
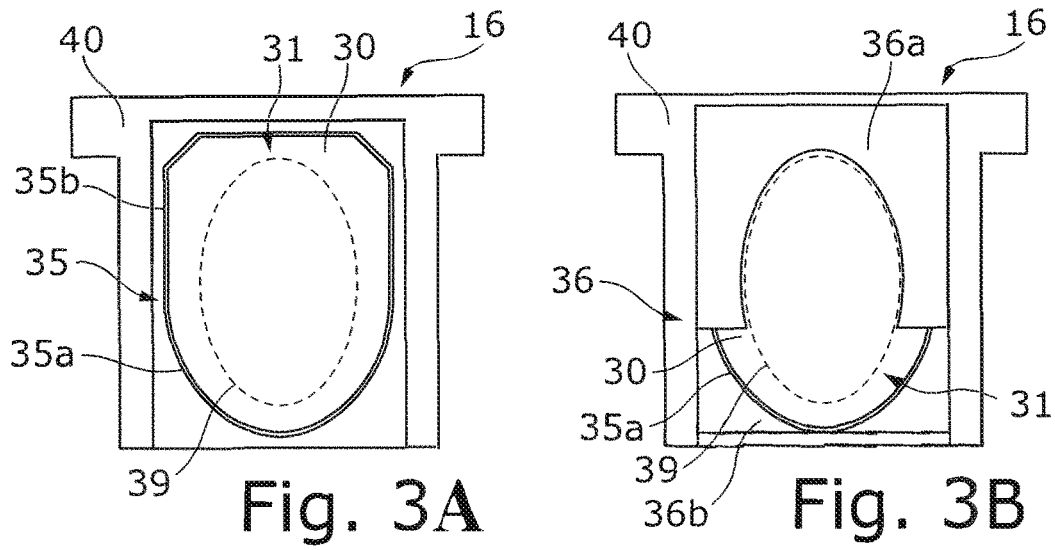
FIGS. 3A and 3B show schematic illustrations of an optical element having surface regions to be protected, respectively, without and with a screen for shielding the surface regions.

FIGS. 3A and 3B show the fifth reflective optical element 16 of the illumination system 10 in an illustration without a shield (cf. FIG. 3A) and with a shield in the form of a screen 36 (cf. FIG. 3B). As is evident in FIG. 3A, the main body 30 of the reflective optical element 16 has a lateral surface region 35 having a section 35a tapering in a tongue-shaped manner, a lower section in FIG. 3B. The tongue-shaped section 35a of the lateral surface region 35 is covered laterally by a lateral screen section 36b—shown in FIG. 3B—of a bipartite screen 36 in the manner illustrated in association with FIG. 2A. A section 35b extending substantially rectangularly, an upper section in FIG. 3A, of the surface region 35 extending laterally circumferentially is covered by a part of the screen 36 that is embodied in the manner as illustrated in FIG. 2B. Regarding the part of the screen 36 covering the upper section 35b of the main body 30, only the over-projecting screen section 36a of said part is discernible in FIG. 3B.

The screen 36, to put it more precisely the over-projecting screen section 36a, covers the reflective coating 31 partly outside the optically used region 39, illustrated in a dashed manner in FIG. 3A. As is evident in FIG. 3B, the over-projecting screen section 36a ends at the upper end of the reflective optical element 16 in FIG. 3B, that is to say that there the screen 36 protects only the laterally circumferentially extending surface region 35 of the main body 30, as is illustrated in FIG. 2A.

In contrast to the illustration shown in FIG. 3B, it is possible for the over-projectingregion 36a of the screen 36 not only to be formed in the upper section 35b of the lateral surface region 35, but to extend along the lateral circumference of the entire reflective surface 31. In particular, the over-projecting screen section 36a can optionally serve to protect the reflective coating 31 itself at the (sharp) edge formed by the latter and/or the front side 32a of the main body 30 with the lateral surface region 35 against an etching attack.

Figure 4A:
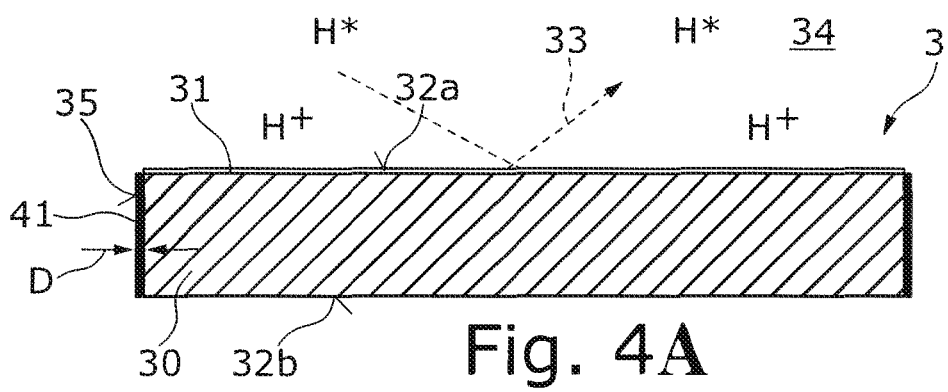
FIGS. 4A and 4B show, respectively, a sectional illustration and a plan view of an optical element, to the main body of which a layer serving as a shield is applied directly.
Figure 4B:
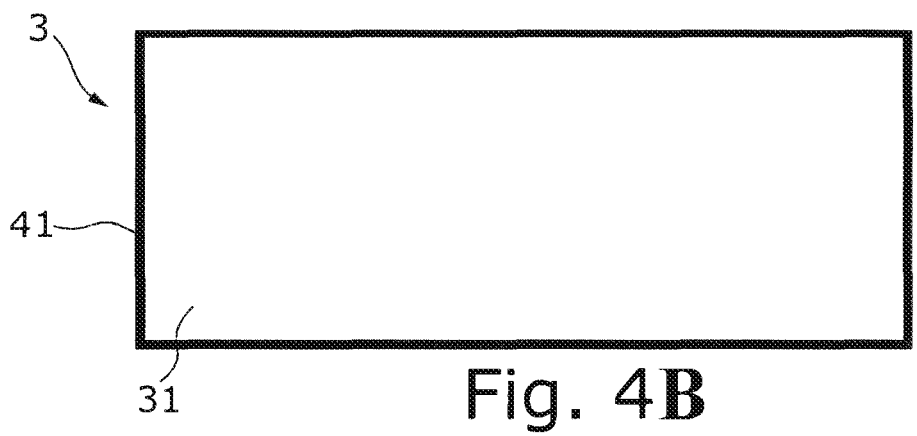

FIGS. 4A and 4B show by way of example the collector mirror 3 of the illumination system 10 in a sectional illustration and in a plan view. The collector mirror 3 has a reflective coating 31 at its front side 32a, which reflective coating, in the example shown, is a multilayer coating for reflecting EUV radiation 33 incident with normal incidence on the collector mirror 3. For this purpose, the reflective multilayer coating 31 has a plurality of layers having alternately a high and a low real part of the refractive index. The collector mirror 3 is also exposed to a hydrogen plasma H$^+$, H$^*$ during operation of the EUV lithography apparatus 1. In order to prevent the material of the main body 30, which can be Si, SiC or SiO$_2$ in the example shown, from being exposed to the surrounding hydrogen plasma H$^+$, H$^*$, a shield in the form of a coating 41 is applied to a circumferentially extending lateral surface region 35 of the main body 30. The coating 41 serving as a shield is applied to the lateral surface region 35 directly, i.e. without the formation of a gap, with the result that the distance A between the lateral surface region 35 and the shield in the form of the coating 41 is equal to zero.

As materials for the coating 41 serving as a shield, the metallic or ceramic materials described further above in association with FIGS. 2A and 2B can be used, for example, which are insensitive to an etching attack of the hydrogen plasma H$^+$, H$^*$ to the greatest possible extent since these materials do not enter into reactions with the hydrogen plasma H$^+$, H$^*$ in which readily volatile etching products arise. In the example shown, the shield in the form of the coating 41 is formed from ruthenium, which additionally has a high recombination capability for hydrogen radicals H$^+$, H$^*$, with the result that this material provides protection of the main body 30 against the surrounding hydrogen plasma H$^+$, H$^*$ in two respects (see above).

The material of the coating 41 serving as a shield should ensure a maximum coverage of the lateral surface region 35 in order to ensure that the fewest possible hydrogen ions H$^+$ or hydrogen radicals H$^*$ can penetrate as far as the lateral surface region 35. Within the meaning of this application, coverage is understood to mean that proportion of the surface which is covered with a protective coating material and thus no longer contributes to contamination on account of the etching process. The coverage by the coating 41 serving as a shield should be as great as possible and ideally more than 97%. Besides being dependent on the surface constitution of the main body 30 and the material of the coating 41 serving as a shield, the coverage is also dependent on the thickness D of the coating 41. Said thickness D should typically be not less than approximately 50 nm and not greater than hundreds of nanometers, for example less than approximately 500 nm or less than approximately 200 nm.

The thickness D of the coating 41 serving as a shield, which is formed from a single layer of ruthenium in the example shown in FIGS. 4A and 4B, can optionally vary in a location-dependent manner, but is generally constant. The maximum thickness D of the coating 41 serving as a shield is limited by the layer stress, inter alia. The layer stresses in the coating 41 should not prove to be so great that they result in a significant alteration of the surface geometry of the front side 32a of the main body 30 (figure).

In order to prevent this, the coating 41 serving as a shield can comprise two or more layers, the layer stresses of which compensate for one another at least partly, in particular completely. In the case of such a coating 41 comprising a plurality of layers, the outermost layer, which is exposed to the surrounding hydrogen plasma H$^+$, H$^*$, is formed from a material that is as insensitive as possible to an etching attack, while this property is possibly not absolutely necessary for the materials of the underlying layers. In particular, the coating 41 can have a periodic sequence of layers or plies composed of a first material and a second material in order to simplify the compensation of the layer stresses. The first material, having an intrinsic tensile stress, can be for example copper, silver, gold, chromium or a nickel-chromium alloy in which the ratio of chromium:nickel is between 30:70 (% by weight) and 70:30 (% by weight). The second material, having an intrinsic compressive stress, can be ruthenium or silicon, for example. Materials other than those mentioned can also be used for the compensation of layer stresses.

The materials of the layer(s) of the coating 41 serving as a shield which are applied below the outermost layer, in order to bring about stress compensation, can be NiSi or WB4C, for example. The layer stress of the coating 41 serving as a shield can be adjusted in a targeted manner by the use of at least one stress-compensating layer. In this way, the thickness D of the outermost layer providing the protection against the surrounding hydrogen plasma H$^+$, H$^*$, or of the entire coating 41 serving as a shield, can prove to be greater than was indicated further above. The coating 41 serving as a shield can be applied to the main body 30 with a conventional directional or nondirectional coating method. During the application of the coating 41 serving as a shield, the front side 32a of the main body 30 and/or the reflective coating 31 should be protected suitably, for example by the use of a screen.

Figure 5A:
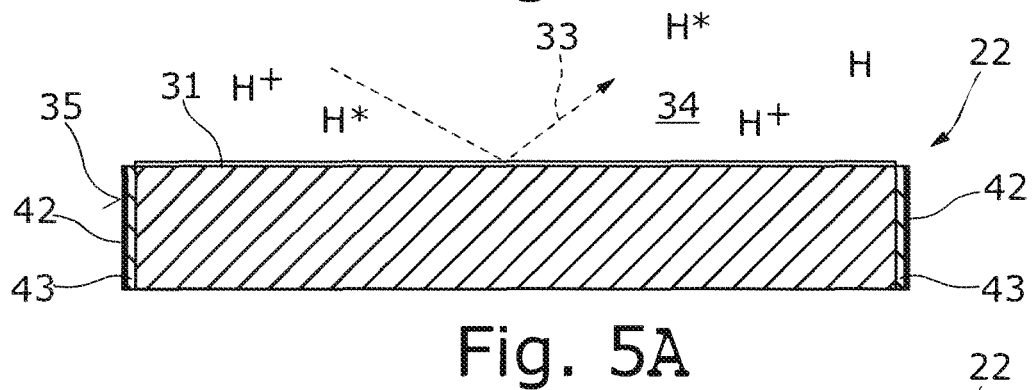
FIGS. 5A and 5B show, respectively, a sectional illustration and a plan view of an optical element with a shield in the form of a protective film connected to the main body by way of an adhesive layer.
Figure 5B:
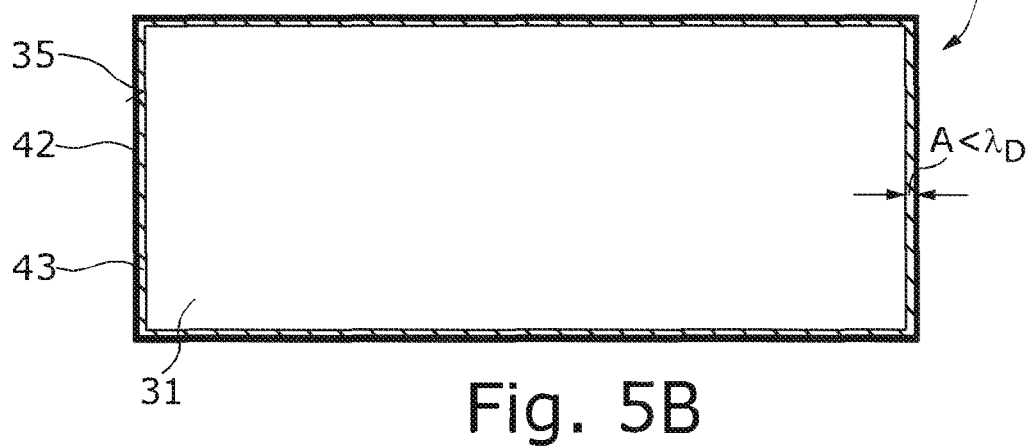

FIGS. 5A and 5B show by way of example the second reflective optical element 22 of the projection lens 20 in a sectional illustration and in a plan view. In this case, too, the reflective coating 31 is configured for the reflection of EUV radiation 33 with normal incidence. In the example shown, the material of the main body 30 is ULE®, i.e. titanium-doped quartz glass.

In the case of the reflective optical element 22 illustrated in FIGS. 5A and 5B, said reflective optical element likewise being exposed to a hydrogen plasma H$^+$, H$^*$ present in the vacuum environment 34, a shield embodied as a protective film 42 or as a protective foil is provided at the lateral surface region 35. The protective film 42 is to the greatest possible extent impermeable to hydrogen ions H$^+$ and insensitive to an etching attack. The protective film 42 therefore protects the lateral surface region 35 against ion etching by hydrogen ions H$^+$. The protective film 42 is connected to the main body 30, to put it more precisely to the lateral surface region 35, by an indirect, typically cohesive connection. In order to produce the cohesive connection, a connecting material 43 in the form of an adhesive layer, for example, can be introduced between the main body 30 and the protective film 42. The use of a connecting material 43 in the form of a double-sided adhesive tape or of other suitable materials, e.g. of a solder, is also possible.

The connection or the connecting material 43 should be chosen such that the transfer of mechanical stresses to the main body 30 is avoided as much as possible. This can typically be ensured by the use of an adhesive or an adhesive tape having a low (volume) shrinkage of e.g. less than approximately 0.5% during and after the production of the adhesive connection. Optionally other joining methods, for example soldering, . . . can be used to apply the protective film 42 to the main body 30. The connection or the connecting material 43 should also be as insensitive as possible to the ambient conditions prevailing in the EUV lithography apparatus 1, particularly if the connecting material 43 is not completely covered by the protective film 42.

The protective film 42 itself is formed from a typically metallic or ceramic material that is resistant to an etching effect of the hydrogen plasma H$^+$, H$^*$ or that at least has a greater resistance to the etching effect of the plasma H$^+$, H$^*$ than the underlying material of the main body 30. In particular, the protective film 42 can comprise one or more of the materials described further above in association with the shield embodied as a screen 36. In the case of metallic materials, the protective film 42 should have a maximum thickness D that is less than approximately 50 µm, preferably less than approximately 20 µm. The (maximum) distance A between the protective film 43 and the lateral surface region 35 is less than double the Debye length $\lambda_D$, preferably less than the Debye length $\lambda_D$. The Debye length $\lambda_D$ is typically less than 5 mm, less than 0.5 mm or less than 0.1 mm.

In order to increase the protective effect against the etching effect of the surrounding hydrogen plasma $H^+$, $H^*$, the measures illustrated in FIGS. 2A and 2B and/or in FIGS. 3A and 3B can also be combined with the measures illustrated in FIGS. 4A and 4B or in FIGS. 5A and 5B: Therefore, a shield in the form of a screen 36 and also the coating 41 serving as a shield as shown in FIGS. 4A and 4B or the protective film 42 shown in FIGS. 5A and 5B can be used at one and the same reflective optical element 16. The coating 41 serving as a shield and the protective film 42 can also be used at different surface regions of one and the same reflective optical element. Moreover, it is not absolutely necessary for the shield 36, 41, 42 to be of integral design, rather said shield can be composed of a plurality of component parts.

Optionally, in addition to the resistance to the etching effect of the plasma, the materials used for the shield 36, 41, 42 can also fulfil other functions; by way of example, they can have an absorbing effect for the EUV radiation 33, as is the case e.g. for NiSi or WB4C.

What is claimed is:

1. An optical arrangement for extreme ultraviolet (EUV) radiation, comprising:
    at least one reflective optical element having a main body with a reflective coating that is disposed on a front side of the main body and is configured to reflect the EUV radiation and with at least one surface region on a lateral side of the main body, and
    at least one shield comprising a screen separated from the at least one surface region by an empty gap, and is configured to protect the at least one surface region against an etching effect of a plasma that surrounds the reflective optical element during operation of the optical arrangement,
    wherein the at least one shield at least partially covers the at least one surface region at a distance (A),
    wherein the distance (A) between the shield and the surface region of the main body is less than double the Debye length ($\lambda_D$) of the surrounding plasma, and
    wherein the Debye length ($\lambda_D$) is less than 0.5 mm.

2. The optical arrangement as claimed in claim 1, wherein the distance (A) between the shield and the surface region of the main body is less than the Debye length ($\lambda_D$) of the surrounding plasma.

3. The optical arrangement as claimed in claim 1, wherein the screen, at least at a side facing the gap, has a coating composed of a hydrogen recombination material, or wherein the screen consists of a hydrogen recombination material.

4. The optical arrangement as claimed in claim 3, wherein the hydrogen recombination material forms a contamination getter material selected from the group consisting of: Ir, Ru, Pt, Pd.

5. The optical arrangement as claimed in claim 1, wherein the screen has a screen section projecting at least partly over the reflective coating, applied to the main body, outside an optically used region of the reflective optical element.

6. The optical arrangement as claimed in claim 5, wherein the screen section projects over the reflective coating over a length (L) that is greater than a width (A) of the gap, which equals the distance (A) between the shield and the surface region of the main body.

7. The optical arrangement as claimed in claim 1, wherein the Debye length ($\lambda_D$) is less than 0.1 mm.

8. The optical arrangement as claimed in claim 1, wherein the material of the shield is a metallic material or a ceramic material.

9. The optical arrangement as claimed in claim 8, wherein the material of the shield is selected from the group consisting of: Cu, Co, Pt, Ir, Pd, Ru, Al, high-grade steel, $AlO_x$, and $Al_2O_3$.

10. The optical arrangement as claimed in claim 1, wherein the main body comprises at least one material selected from the group consisting of: quartz glass, titanium-doped quartz glass, glass ceramic, silicon, aluminum, copper, silicon-containing alloys, aluminum-containing alloys, copper-containing alloys, and compounds or composites thereof.

11. The optical arrangement as claimed in claim 1, comprising:
    an EUV light source for generating the EUV radiation,
    an illumination system for illuminating a structured object with the EUV radiation, and
    a projection lens for imaging the structured object onto a substrate.

12. The optical arrangement as claimed in claim 11, wherein the reflective optical element is a collector mirror for focusing the EUV radiation of the EUV light source, or a reflective optical element, disposed adjacent to the structured object, of the illumination system.

13. An optical arrangement for extreme ultraviolet (EUV) radiation, comprising:
    at least one reflective optical element having a main body with a reflective coating that reflects the EUV radiation, and
    at least one shield fitted to the at least one surface region of the main body,
    at least one shield forming a protective film as at least one protective foil, wherein the protective film is indirectly connected to the at least one surface region of the main body and protects the at least one surface region against an etching effect of a plasma that surrounds the reflective optical element during operation of the optical arrangement,
    wherein the at least one surface region is arranged outside of the reflective coating and forms a lateral surface region of the main body,
    wherein a distance (A) between the shield and the surface region of the main body is less than double the Debye length ($\lambda_D$) of the surrounding plasma,
    wherein a connecting material for cohesively connecting the protective film to the main body is disposed between the protective film and the protected surface region, and
    wherein the connecting material is an adhesive.

14. The optical arrangement as claimed in claim 13, wherein the distance (A) between the shield and the surface region of the main body is less than the Debye length ($\lambda_D$) of the surrounding plasma.

15. The optical arrangement as claimed in claim 13, wherein the protective film has a maximum thickness (D) of less than 50 µm.

* * * * *

UNITED STATES PATENT AND TRADEMARK OFFICE
CERTIFICATE OF CORRECTION

PATENT NO. : 11,137,687 B2
APPLICATION NO. : 16/778775
DATED : October 5, 2021
INVENTOR(S) : Liebaug et al.

Page 1 of 1

It is certified that error appears in the above-identified patent and that said Letters Patent is hereby corrected as shown below:

In the Specification

Column 14, Line 13, after "over-projecting" insert -- screen --.

Column 14, Line 52, delete "over-projectingregion" insert -- over-projecting region -- therefor.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*